(12) United States Patent
Kim et al.

(10) Patent No.: US 8,872,996 B2
(45) Date of Patent: Oct. 28, 2014

(54) LIGHT SOURCE MODULE AND BACKLIGHT ASSEMBLY HAVING THE SAME

(71) Applicant: Samsung Display Co., Ltd., Youngin (KR)

(72) Inventors: Hyun-Jeong Kim, Hwanseong-si (KR); Hyuk-Hwan Kim, Hwanseong-si (KR); Young-Jun Seo, Seoul (KR); Hyung-Jin Kim, Seoul (KR); Seok-Hyun Nam, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/719,361

(22) Filed: Dec. 19, 2012

(65) Prior Publication Data

US 2014/0036540 A1   Feb. 6, 2014

(30) Foreign Application Priority Data

Aug. 6, 2012   (KR) .................. 10-2012-0085719

(51) Int. Cl.
*G02F 1/1333*   (2006.01)
*F21V 8/00*   (2006.01)
*H01L 33/64*   (2010.01)

(52) U.S. Cl.
CPC ............ *G02B 6/0068* (2013.01); *G02B 6/0011* (2013.01); *H01L 33/642* (2013.01)
USPC ............................................. 349/58; 362/602

(58) Field of Classification Search
USPC .............................. 362/606–608, 613; 349/58
See application file for complete search history.

(56) References Cited

U.S. PATENT DOCUMENTS

| | | | |
|---|---|---|---|
| 6,936,855 B1 * | 8/2005 | Harrah | 257/88 |
| 8,113,704 B2 * | 2/2012 | Bae et al. | 362/613 |
| 2007/0229753 A1 * | 10/2007 | Cheng et al. | 349/161 |
| 2009/0231297 A1 * | 9/2009 | Hatakeyama | 345/173 |
| 2010/0195014 A1 | 8/2010 | Arihara | |
| 2010/0290246 A1 | 11/2010 | Kim et al. | |
| 2011/0134364 A1 | 6/2011 | Neyama et al. | |

* cited by examiner

*Primary Examiner* — Mary Ellen Bowman
(74) *Attorney, Agent, or Firm* — Cantor Colburn LLP

(57) ABSTRACT

In a light source module and a backlight assembly having the light source module, the light source module includes a flexible printed circuit board; a light source part on an upper surface of the flexible printed circuit board and including a light emitting chip; a substrate on a lower surface of the flexible printed circuit board; and a heat dissipating part which extends from the light emitting chip and contacts the substrate.

20 Claims, 3 Drawing Sheets

LIGHT SOURCE MODULE AND BACKLIGHT ASSEMBLY HAVING THE SAME

This application claims priority to Korean Patent Application No. 10-2012-0085719, filed on Aug. 6, 2012, and all the benefits accruing therefrom under 35 U.S.C. §119, the contents of which in its entirety is herein incorporated by reference.

BACKGROUND

1. Field

Exemplary embodiments of the invention relate to a light source module, and a backlight assembly having the light source module. More particularly, exemplary embodiments of the invention relate to a light source module used for a display apparatus, and a backlight assembly having the light source module.

2. Description of the Related Art

A display apparatus includes a display panel displaying an image, and a backlight assembly providing light to the display panel. A light emitting diode ("LED") may be used as a light source for the backlight assembly. In addition, an edge-illumination type backlight assembly in which the light source is disposed at a side of the backlight assembly, may be used so as to decrease an overall thickness of the display apparatus.

Further, a corner-illumination type backlight assembly has been adopted. In the corner-illumination type backlight assembly, the light source is disposed at a corner portion at which adjacent side surfaces of a light guide plate are connected to each other. Thus, the light source at the corner portion may occupy less area within the backlight assembly, and light efficiency may be increased.

However, in the corner-illumination type backlight assembly, since two adjacent sides of the light guide plate extend substantially perpendicular to each other and since it may be difficult to bend a printed circuit board ("PCB") vertically or perpendicularly, separate and multiple PCBs are respectively disposed at the adjacent sides of the light guide plate to drive the LED when the LED is used as the light source. Thus, a connector or a wiring connected to the PCBs may be undesirably complicated. Furthermore, a bezel outside of a display area of the display apparatus which includes the above-described corner-illumination type backlight assembly may be undesirably increased due to the separate and multiple PCBs.

In addition, in the corner-illumination type backlight assembly, even though an area occupied by the light source is reduced, heat generated from the light source is focused on a particular area which may undesirably cause a hot spot. Thus, the heat generated from the light source should be efficiently dissipated such that the hot spot occurring at a portion in which the light source is disposed is effectively prevented.

SUMMARY

One or more exemplary embodiment of the invention provides a light source module with a simple structure and configured to dissipate heat efficiently.

One or more exemplary embodiments of the invention also provides a backlight assembly having the light source module.

In an exemplary embodiment of a light source module according to the invention, the light source module includes a flexible printed circuit board ("FPC"); a light source part on an upper surface of the FPC and including a light emitting chip; a substrate on a lower surface of the FPC; and a heat dissipating part which extends from the light emitting chip and contacts the substrate.

In an exemplary embodiment, the FPC may include an insulating layer, and a metal layer disposed under the insulating layer.

In an exemplary embodiment, the light emitting portion may be on a first portion of the insulating layer, and a thickness of the first portion may be less than a thickness of a remaining portion of the insulating layer.

In an exemplary embodiment, the substrate may include a metal material, and the metal layer of the FPC and the substrate may be pressed together at a high temperature and a high pressure to fix the metal layer of the FPC and the substrate to each other.

In an exemplary embodiment, the metal layer may include copper (Cu), and the substrate may include aluminum (Al).

In an exemplary embodiment, the FPC may include a via-hole at a portion in which the light emitting chip is mounted, and the heat dissipating portion may extend through the via-hole of the FPC.

In an exemplary embodiment, the light source module may include a plurality of via-holes and a plurality of heat dissipating portions.

In an exemplary embodiment, the heat dissipating portion may have a column shape.

In an exemplary embodiment, the heat dissipating portion may include copper (Cu).

In an exemplary embodiment, the light source part may include a light emitting diode ("LED").

In an exemplary embodiment, the light source module may further include a protective portion enclosing an upper portion of the FPC and the light source part.

In an exemplary embodiment of a backlight assembly according to the invention, the backlight assembly includes a light guide plate and a light source module. The light guide plate guides light. The light source module is disposed adjacent to the light guide plate and provides the light to the light guide plate. The light source module includes a FPC; a light source part on an upper surface of the FPC and including a light emitting chip; a substrate on a lower surface of the FPC; and a heat dissipating part which extends from the light emitting chip and contacts the substrate.

In an exemplary embodiment, the light source module may be disposed to face a side surface of the light guide plate.

In an exemplary embodiment, the light guide plate may include first and second side surfaces connected with each other and adjacent to each other. The light source module may be disposed to face the first and second side surfaces.

In an exemplary embodiment, the light source module may include a plurality of light source parts and a plurality of substrates. A first light source part faces the first side surface, and a second light source part faces the second side surface. The FPC may include a first portion facing the first side surface and a second portion facing the second side surface. A first substrate faces the first side surface and a second substrate faces the second side surface.

In an exemplary embodiment, the first and second light source parts may be spaced apart from each other, and the first and second substrates may be spaced apart from each other.

In an exemplary embodiment, the FPC may further include a connecting portion connecting the first and second portion with each other.

In an exemplary embodiment, the first portion, the connecting portion and the second portion may be integrally formed with each other to form a single, unitary, indivisible flexible body.

In an exemplary embodiment, the first and second side surfaces may extend substantially perpendicular to each other.

In an exemplary embodiment, the light source module may face a portion of the first side surface and a portion of the second side surface.

According to one ore more exemplary embodiment of the invention, a heat dissipating portion extends from a light emitting chip of a light source part to make contact with a substrate through a via-hole of a FPC. Thus, heat from the light source part may be efficiently dissipated.

In addition, the heat dissipating part and the substrate include a metal material, to increase the heat-dissipation. Thus, a hot spot which decreases image quality may be reduced or effectively prevented.

In addition, an additional mold structure is omitted over a light source part of the light source module and a protective portion is used to directly enclose the light source part of the light source module. Thus, an overall thickness of the light source module may be decreased.

In addition, the substrate is pressed on the FPC to be fixed to the FPC, and a thickness of an insulating layer of the FPC is decreased at a portion in which the light emitting chip is disposed. Thus, an overall thickness of the light source module may be further decreased. In addition, a bezel of the display apparatus may be decreased.

In addition, since the FPC includes a flexible material, the light source part may be disposed adjacent to both of adjacent side surfaces of a light guide plate which are substantially perpendicular to each other, at the same time and without using separate circuit boards. Thus, a wiring or a connector may be simplified, compared to the light source parts disposed independently and dividedly in a conventional backlight assembly.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION

Figure 1:
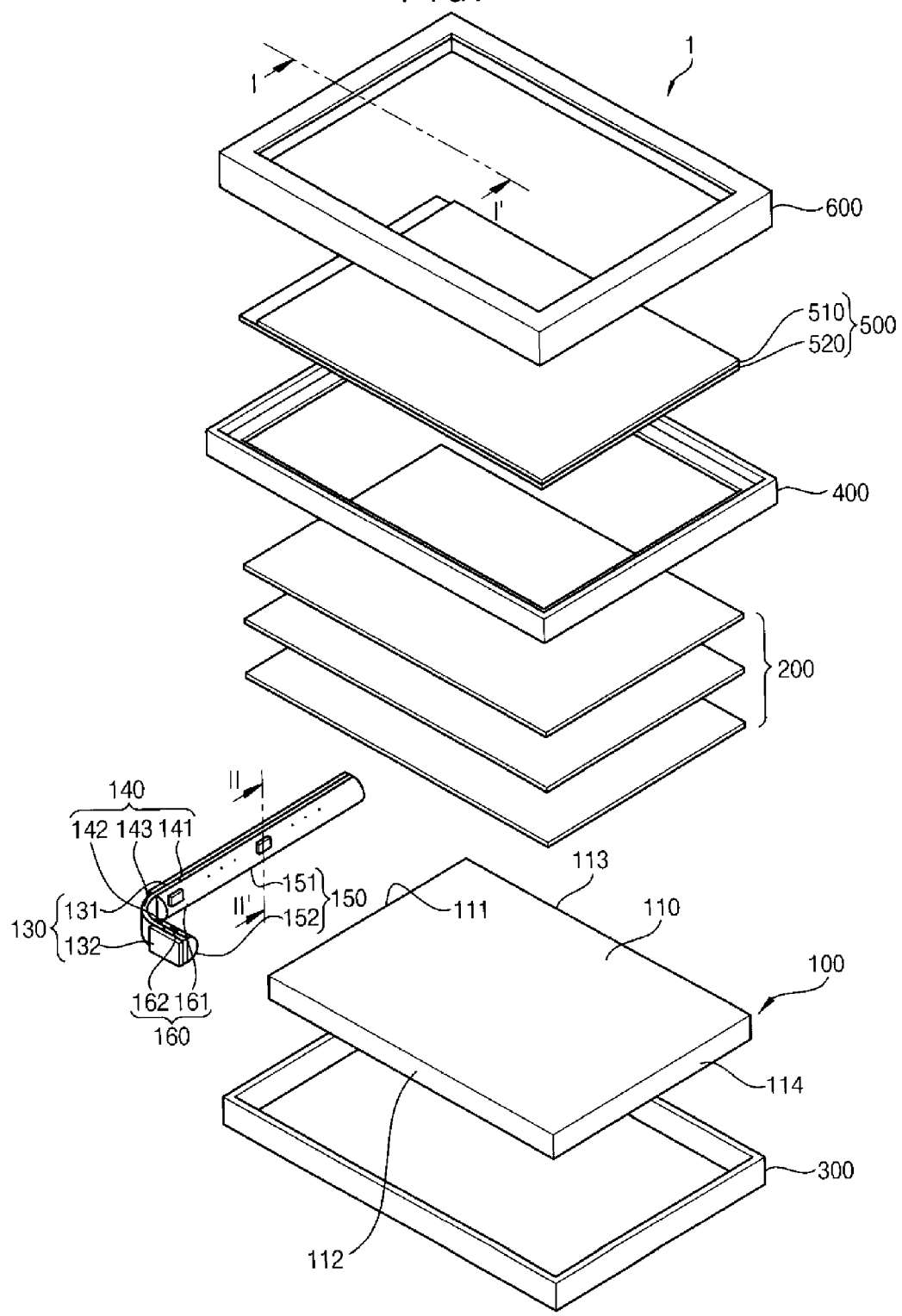
FIG. 1 is an exploded perspective view illustrating an exemplary embodiment of a display apparatus according to the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the invention will be described in further detail with reference to the accompanying drawings.

Figure 2:
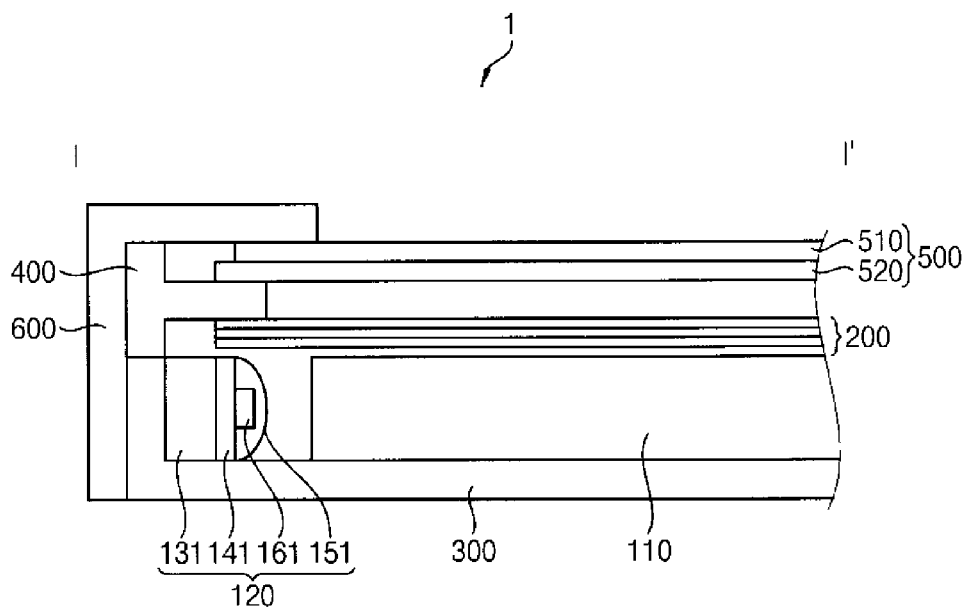
FIG. 2 is a cross-sectional view taken along line I-I' in FIG. 1.

FIG. 1 is an exploded perspective view illustrating an exemplary embodiment of a display apparatus according to the invention. FIG. 2 is a cross-sectional view taken along line I-I' in FIG. 1.

Referring to FIGS. 1 and 2, the exemplary embodiment of the display apparatus 1 according to the invention includes a backlight assembly 100, optical sheets 200, a receiving container 300, a mold frame 400, a display panel 500 and a cover frame 600.

The backlight assembly 100 provides light to the display panel 500. The optical sheets 200 are disposed over the backlight assembly 100 and enhance a quality of the light provided to the display panel 500. The receiving container 300 includes a bottom plate and sidewalls to form a receiving space, and the backlight assembly 100 and the optical sheets 200 are received by the receiving space. The mold frame 400 is disposed over the optical sheets 200 and is fixed to the sidewalls of the receiving container 300, to support the display panel 500.

The display panel 500 receives the light from the backlight assembly 100 and display an image using the received light. To display the image, the display panel 500 may includes first and second substrates 510 and 520 facing each other, and a liquid crystal layer between the first and second substrates 510 and 520. The display panel 500 may include a display area exposed by the cover frame 600, and a non-display area excluding the display area.

The cover frame 600 is disposed over the display panel 500, fixes an edge of the display panel 500, and is combined with the mold frame 400 and the receiving container 300, to form an outer shape of the display apparatus 1 in a plan view of the display apparatus 1. In an exemplary embodiment, a distance or planar area between an edge of the outer shape and the display area may be considered a bezel of the display apparatus, or the bezel may be a portion of the distance or planar area.

A structure of the display apparatus 1 may not be limited thereto as illustrated in FIG. 1, and may be variously changed.

The backlight assembly 100 includes a light guide plate 110 and a light source module 120. The light guide plate 110 guides the light from the light source module 120 and provides the light to the display panel 500 disposed over the backlight assembly 100.

In one exemplary embodiment, for example, the light guide plate 110 may have a rectangular plate shape having a predetermined thickness, and long and short sides. The light guide plate 110 includes first, second, third and fourth side surfaces 111, 112, 113 and 114. The first and fourth side surfaces 111 and 114 extend substantially parallel with each other and face each other. The second and third side surfaces 112 and 113 extend substantially parallel with each other and face each other. Thus, the first and second side surfaces 111 and 112, and the first and third side surfaces 111 and 113, are adjacent to each other and respectively meet at a corner portion of the light guide plate 110. The first and second side surfaces 111 and 112 are substantially perpendicular to each other, and the first and third side surfaces 111 and 113 are substantially perpendicular to each other. A shape of the light guide plate 110 may not be limited thereto as illustrated in FIG. 1, and may be variously changed.

The light source module 120 is disposed adjacent to the first side surface 111 of the light guide plate 110, and generates and provides the light to the light guide plate 110. The light source module 120 includes an extruded substrate 130, a flexible printed circuit board ("FPC") 140, a protective portion 150 and a light source part 160. The light source module 120 may include a plurality of the light source parts 160.

In the illustrated exemplary embodiment, the light source module 120 is disposed adjacent to both the first side surface 111 and the second side surface 112 of the light guide plate 110. In one exemplary embodiment, for example, the light source module 120 is disposed adjacent to both a first portion of the first side surface 111 and a first portion of the second side surface 112, where the portions of the first and second side surfaces 111 and 112 extend from a corner portion of the light guide plate 110 at which the first and second side surfaces 111 and 112 meet each other. Thus, each of the first and second side surfaces 111 and 112 of the light guide plate 110 has a second portion at which the light source module 120 is not disposed.

As illustrated in FIG. 1, when the first side surface 111 is smaller than the second side surface 112, the light source module 120 faces a larger portion of the first side surface 111 than the second side surface 112. In one exemplary embodiment, for example, a number of the light source parts 160 of the light source module 120 facing the first side surface 111 is more than that of the light source parts 160 of the light source module 120 facing the second side surface 112. Thus, an amount of incident light which is substantially parallel to the second side surface 112 is greater than the incident light which is substantially parallel to the first side surface 111, so that the light guided by the light guide plate 110 may be more uniformly controlled.

A collective extruded substrate unit 130 may include a plurality of separate extruded substrates, but is not limited thereto or thereby. As illustrated in FIG. 1, the extruded substrate 130 collectively includes a first extruded substrate 131 and a second extruded substrate 132. A collective FPC unit 140 may include a plurality of separated FPCs, but is not limited thereto or thereby. As illustrated in FIG. 1, the FPC 140 includes a first FPC 141, a second FPC 142 and a connecting portion 143. A collective protecting portion unit may include a plurality of separate protecting portions, but is not limited thereto or thereby. As illustrated in FIG. 1, the protecting portion 150 includes a first protecting portion 151 and a second protecting portion 152. The light source part 160 includes a first light source part 161 and a second light source part 162.

The first extruded substrate 131, the first FPC 141, the first protecting portion 151 and the first light source part 161 face the first side surface 111 of the light guide plate 110. The second extruded substrate 132, the second FPC 142, the second protecting portion 152 and the second light source part 162 face the second side surface 112 of the light guide plate 110. The connecting portion 143 effectively faces the corner portion of the light guide plate 110 at which the first and second side surfaces 111 and 112 meet.

Here, the first extruded substrate 131 and the second extruded substrate 132 are spaced apart from each other, each have a longitudinal axis and the longitudinal axes extend substantially perpendicular to each other. Likewise, the first and second protecting portions 151 and 152 are spaced apart from each other, each have a longitudinal axis and the longitudinal axes extend substantially perpendicular to each other.

A collective light source part unit 160 may include a plurality of first light source parts 161 and/or a plurality of second light source parts 162. As illustrated in FIG. 1, the light source part unit 160 includes a plurality of first light source parts 161 and a second light source part 162, but the invention is not limited thereto or thereby. The plurality of first light source parts 161 are arranged along a first longitudinal axis, and the second light source part 162 may be considered as arranged on a second longitudinal axis. The first and second light source parts 161 and 162 are spaced apart from each other, and the first and second longitudinal axes extend substantially perpendicular to each other.

However, even though the first FPC 141 and the second FPC 142 extend substantially perpendicular to each other, the first FPC 141 and the second FPC 142 are connected with each other via the connecting portion 143. In one exemplary embodiment, for example, the connecting portion 143 is curved or bent to connect the first and second FPCs 141 and 142 with each other, and thus the first FPC 141, the second FPC 142 and the connecting portion 143 are integrally formed with each other to form a single, unitary, indivisible, pliable body. Here, the collective FPC unit 140 includes a flexible material which can be curved or bent.

Accordingly, the light source part unit 160 is mounted on the integrated FPC unit 140, so that the connector or the wiring to drive the light source part unit 160 may be simplified. Thus, complication of the connector or the wiring may be reduced or effectively prevented, compared to a conventional light source module in which separate printed circuit boards ("PCB") are disposed spaced apart from each other, and facing adjacent side surfaces of a light guide plate which are substantially perpendicular to each other.

Further, the light source module 120 has a simpler design, and thus a size or dimension of the bezel of the display apparatus 1 including the light source module 120 may be decreased.

Figure 3:
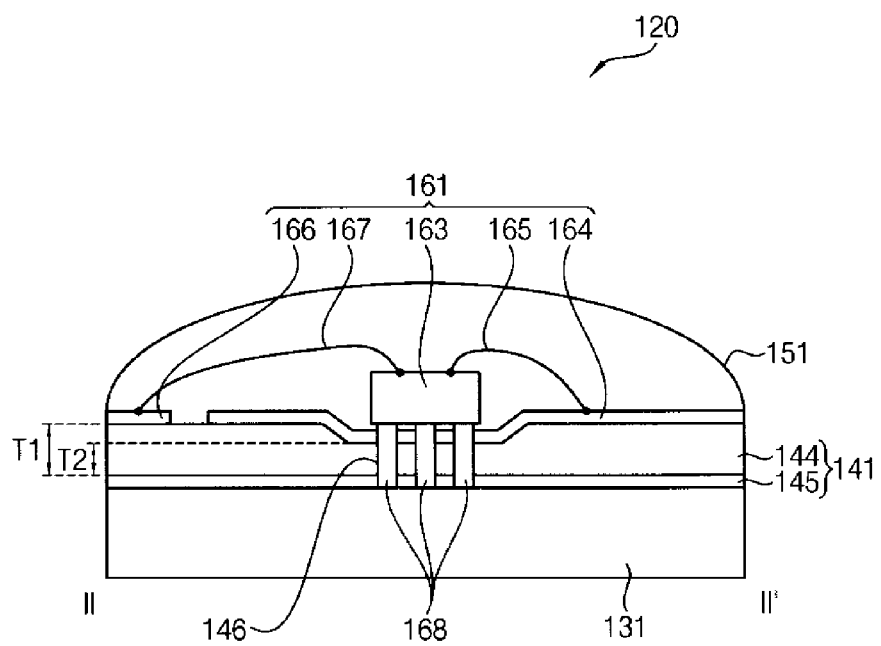
FIG. 3 is a cross-sectional view taken along line II-II' in FIG. 1.

FIG. 3 is a cross-sectional view taken along line II-II' in FIG. 1.

In FIG. 3, a cross-sectional view of a portion of the light source module 120 disposed adjacent to the first side surface 111 is illustrated. In addition, a cross-sectional view of a portion of the light source module 120 disposed adjacent to the second side surface 112 may be substantially same as FIG. 3. FIG. 3 is a cross-sectional view of an arbitrary light source part of the light source module 120, and one or more other light source parts of the light source module 120 has substantially the same the cross-sectional view as illustrated in FIG. 3.

Referring to FIG. 3, the first light source part 161 is mounted on the first FPC 141, and generates and emits light. In the illustrated exemplary embodiment, the first light source part 161 may include a light emitting diode ("LED"), but is not limited thereto or thereby. As the LED, the first light source part 161 includes a light emitting chip 163, a first electrode layer 164, a first wire 165, a second electrode layer 166 and a second wire 167.

The light emitting chip 163 emits the light. The first electrode layer 164 is mounted on the first FPC 141, and the first wire 165 electrically connects the first electrode layer 164 with the first light emitting chip 163. The second electrode layer 166 is mounted on the first FPC 141 and is spaced apart from the first electrode layer 164. The second wire 167 electrically connects the second electrode layer 166 with the light emitting chip 163.

The protecting portion 151 extends over the first light source part 161, to enclose and protect the first light source part 161 and the first FPC 141. Conventionally, a mold portion which has a predetermined frame shape is disposed over the LED and encloses the LED. In the illustrated exemplary embodiment, the mold portion is omitted and the protecting portion 151 directly encloses the LED. Thus, a thickness of the light source may be decreased. Here, the protecting portion 151 has no predetermined frame shape. In addition, end portions of the protecting portion 151 are rounded due to surface tension and the protecting portion 151 is extended over the first light source part 161.

The first FPC 141 includes an insulating layer 144 and a metal layer 145. The first electrode layer 164 and the second electrode layer 166 of the first light source part 161 are on the insulating layer 144, and the light emitting chip 163 is mounted on the insulating layer 144. In one exemplary embodiment, for example, the insulating layer 144 may include polyimide (PI), but is not limited thereto or thereby. The metal layer 145 is beneath the insulating layer 144, and may include a metal material such as copper (Cu), but is not limited thereto or thereby.

The insulating layer 144 has a first thickness T1 at a remaining portion, except for a first portion. The insulating layer 144 has a second thickness T2 at the first portion, and the second thickness T2 is less than the first thickness T1. The light emitting chip 163 of the light source part 161 is mounted on the insulating layer 144 at the thinner first portion. Thus, an overall thickness of the light source module 120 including the first light source part 161 may be minimized. In addition, portions of the insulating layer 144 except for the first portion have a relatively larger thickness than the first portion, and thus a mechanical strength of the first FPC 141 may be enhanced.

The first extruded substrate 131 is on a rear surface of the first FPC 141. In one exemplary embodiment, for example, the first extruded substrate 131 may include a metal material such as aluminum (Al), but is not limited thereto or thereby. The first extruded substrate 131 may be pressed with the metal layer 145 of the first FPC 141 via a pressing process including a high temperature and a high pressure. In one exemplary embodiment, for example, the first extruded substrate 131 includes a metal material such as aluminum, and the metal layer 145 of the first FPC 141 includes a metal material such as copper, and thus when the first extruded substrate 131 and the metal layer 145 face each other and then are pressed with each other with the high temperature and the high pressure, the first extruded substrate 131 and the metal layer 145 are fixed with each other without an additional fixing member such as an adhesive.

A heat dissipating part 168 extends from a rear surface of the light emitting chip 163, to dissipate a heat generated from the light emitting chip 163. The heat dissipating part 168 extends from the rear surface of the light emitting chip 163, and passes through the insulating layer 144 and the metal layer 145 of the first FPC 141, to make contact with an upper surface of the first extruded substrate 131. The first FPC 141 has a via-hole 146 through which the heat dissipating part 168 passes. Thus, the heat generated from the light emitting chip 163 is transmitted to the first extruded substrate 131 through the heat dissipating part 168 and is dissipated to outside the backlight assembly 100 through the first extruded substrate 131. Accordingly, the heat from the light emitting chip 163 may be dissipated more efficiently.

The heat dissipating part 168 may include plural portions, to improve the heat dissipating efficiency. In addition, each portion of the heat dissipating part 168 may have a column shape such as a cylindrical shape, a rectangular column shape and so on, so as to fix and support the light emitting chip 163 more stably.

Figure 4:
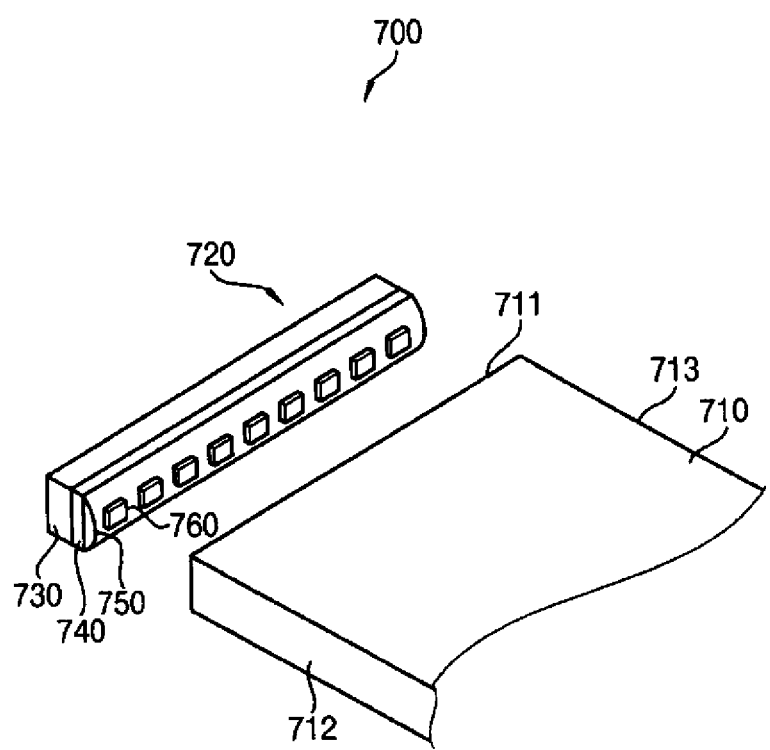
FIG. 4 is an exploded perspective view illustrating another exemplary embodiment of a backlight assembly according to the invention.

FIG. 4 is an exploded perspective view illustrating another exemplary embodiment of a backlight assembly according to the invention.

Referring to FIG. 4, the exemplary embodiment of backlight assembly 700 according to the invention includes a light guide plate 710 and a light source module 720. The backlight assembly 700 in FIG. 4 is substantially the same as that in FIG. 1, except for an arrangement or a disposition of the light source module 720. Thus, same reference numerals are used for same elements and any repetitive explanation will be omitted.

The light guide plate 710 has a rectangular plate shape with a predetermined thickness. The light guide plate 710 includes a first side surface 711, second and third side surfaces 712 and 713 facing each other and extending from the first side surface 711, and a fourth side surface (not shown) facing the first side surface 711.

The light source module 720 is disposed adjacent to the first side surface 711. The light source module 720 includes an extruded substrate 730, a FPC 740, a protecting portion 750 and a light source part 760. The light source part 760 heads for or faces the first side surface 711. The light source module 720 may include a plurality of light source parts 760.

The exemplary embodiment of light source module 720 is substantially same as the light source module 120 in FIG. 3, and thus any repetitive explanation will be omitted. In addition, in the light source module 720, the extruded substrate 730 and the FPC 740 may be pressed and in contact with each other, and the light source part 760 is enclosed or encapsulated by the protecting portion 750 without a mold portion having a predetermined frame shape, so that the thickness of the light source module 720 may be decreased. Thus, an exemplary embodiment of a display apparatus having the backlight assembly 700 according to the invention may have a decreased size of the bezel.

According one or more exemplary embodiment of the invention, a light source module includes a heat dissipating portion which extends from a light emitting chip of a light source part to make contact with an extruded substrate through a via-hole of a flexible circuit board. Thus, heat from the light source part may be efficiently dissipated.

In addition, the heat dissipating part and the extruded substrate include a metal material, to increase the heat-dissipation. Thus, a hot spot which decreases image quality may be reduced or effectively prevented.

In addition, an additional mold structure is omitted over the light source module and a protective portion is used to directly enclose the light source part of the light source module. Thus, an overall thickness of the light source module may be decreased.

In addition, the extruded substrate is pressed on the flexible circuit board to be fixed to the flexible circuit board, and a thickness of an insulating layer of the flexible circuit board is decreased at a portion in which the light emitting chip is disposed. Thus, an overall thickness of the light source module may be further decreased. In addition, a bezel of the display apparatus may be decreased.

In addition, since the flexible circuit board includes a flexible material, the light source part may be disposed adjacent to both of adjacent side surfaces of a light guide plate which are substantially perpendicular to each other, at the same time and without using separate circuit boards. Thus, a wiring or a connector on a circuit board may be connected more simply, compared to the light source parts disposed independently and dividedly in a conventional backlight assembly.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifies to the disclosed exemplary embodiments, as well as other exemplary embodiments, are intended to be included within the scope of the appended claims. The invention is defined by the following claims, with equivalents of the claims to be included therein.

What is claimed is:

1. A light source module comprising:
   a flexible printed circuit board comprising a same upper surface in both a first plane, and in a second plane substantially perpendicular to the first plane;
   a light source part on the upper surface in the first plane and on the upper surface in the second plane of the flexible printed circuit board, and comprising a light emitting chip;
   a substrate on a lower surface opposite to the upper surface in the first plane, and on a lower surface opposite to the upper surface in the second plane, of the flexible printed circuit board; and
   a heat dissipating part which extends from the light emitting chip and contacts the substrate.

2. The light source module of claim 1, wherein the flexible printed circuit board comprises an insulating layer, and a metal layer under the insulating layer.

3. The light source module of claim 2, wherein
   the light emitting chip is on a first portion of the insulating layer; and
   a thickness of the first portion is less than a thickness of a remaining portion of the insulating layer.

4. The light source module of claim 2, wherein
   the substrate comprises a metal material, and
   applying a high temperature and a high pressure to the metal layer of the flexible printed circuit board and the substrate pressedly fixes the metal layer of the flexible printed circuit board and the substrate with each other.

5. The light source module of claim 4, wherein
   the metal layer of the flexible printed circuit board comprises copper (Cu), and
   the metal material of the substrate comprises aluminum (Al).

6. The light source module of claim 1, further comprising a via-hole defined in the flexible printed circuit board and corresponding to the light emitting chip, and exposing an upper surface of the substrate, wherein
   the heat dissipating portion extends through the via-hole of the flexible printed circuit board and contacts the upper surface of the substrate.

7. The light source module of claim 6, further comprising a plurality of via-holes and a plurality of heat dissipating portions.

8. The light source module of claim 6, wherein the heat dissipating portion has a column shape.

9. The light source module of claim 8, wherein the heat dissipating portion comprises copper (Cu).

10. The light source module of claim 1, wherein the light source part further comprises a light emitting diode.

11. The light source module of claim 10, further comprising a protective portion enclosing a portion of the upper surface of the flexible printed circuit board and the light source part.

12. A backlight assembly comprising:
    a light guide plate which guides light; and
    a light source module adjacent to the light guide plate, wherein the light source module generates and provides the light to the light guide plate,
    wherein the light source module comprises:
      a flexible printed circuit board comprising a same upper surface in both a first plane, and in a second plane substantially perpendicular to the first plane;

a light source part on the upper surface in the first plane and on the upper surface in the second plane of the flexible printed circuit board, and comprising a light emitting chip;

a substrate on a lower surface opposite to the upper surface in the first plane and on a lower surface opposite to the upper surface in the second plane, of the flexible printed circuit board; and a heat dissipating part which extends from the light emitting chip and contacts the substrate.

13. The backlight assembly of claim 12, wherein the upper surface of the flexible printed circuit board in both the first and second planes faces a side surface of the light guide plate.

14. The backlight assembly of claim 12, wherein the light guide plate comprises first and second side surfaces adjacent to each other and connected with each other at a corner portion of the light guide plate, and the upper surface of the flexible printed circuit board in both the first and second planes faces the first and second side surfaces of the light guide plate.

15. The backlight assembly of claim 14, wherein a first light source part faces the first side surface of the light guide plate, and a second light source part faces the second side surface of the light guide plate, the flexible printed circuit board comprises a first portion facing the first side surface of the light guide plate, and a second portion facing the second side surface of the light guide plate, and a first substrate faces the first side surface of the light guide plate, and a second substrate faces the second side surface of the light guide plate.

16. The backlight assembly of claim 15, wherein the first and second light source parts are spaced apart from each other along a length of the flexible printed circuit board, and the first and second substrates are spaced apart from each other along the length of the flexible printed circuit board.

17. The backlight assembly of claim 15, wherein the flexible printed circuit board further comprises a connecting portion connecting the first and second portions with each other.

18. The backlight assembly of claim 17, wherein the first portion of the flexible printed circuit board, the connecting portion and the second portion of the flexible printed circuit board collectively form a single, unitary, indivisible flexible body.

19. The backlight assembly of claim 14, wherein the first and second side surfaces of the light guide plate extend substantially perpendicular to each other.

20. The backlight assembly of claim 19, wherein the light source module faces less than an entire of the first side surface of the light guide plate and less than an entire of the second side surface of the light guide plate.

\* \* \* \* \*